(12) United States Patent
Yu

(10) Patent No.: US 6,545,623 B1
(45) Date of Patent: Apr. 8, 2003

(54) HIGH SPEED ANALOG-DOMAIN SHUFFLER FOR ANALOG TO DIGITAL CONVERTER

(75) Inventor: Paul C. Yu, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/712,714

(22) Filed: Nov. 14, 2000

Related U.S. Application Data
(60) Provisional application No. 60/173,043, filed on Dec. 23, 1999.

(51) Int. Cl.[7] ................................................. H03M 1/12
(52) U.S. Cl. ....................................... 341/155; 341/154
(58) Field of Search ................................ 341/155, 154, 341/143, 161, 144, 163; 375/252

(56) References Cited

U.S. PATENT DOCUMENTS

| | | | |
|---|---|---|---|
| 5,257,026 A | * 10/1993 | Thompson et al. | ......... 341/118 |
| 5,404,142 A | 4/1995 | Adams et al. | |
| 5,598,472 A | * 1/1997 | Schuchman et al. | .......... 380/14 |
| 6,218,977 B1 | * 4/2001 | Friend et al. | ................ 341/163 |
| 6,304,608 B1 | * 10/2001 | Chen et al. | .................. 375/252 |

OTHER PUBLICATIONS

Rex T. Baird, et al., "Improved ΔΣ DAC Linearity Using Data Weighted Averaging" IEEE, pp. 13–16, 1995.
Feng Chen, et al., "A High Resolution Multibit Sigma–Delta Modulator with Individual Level Averaging" IEEE Journal of Solid–State Circuits, vol. 30, No. 4, pp. 453–460, Apr. 1995.
Bosco H. Leung, et al., "Multibit Σ–Δ A/D Converter Incorporating a Novel Class of Dynamic Element Matching Techniques" IEEE Transactions on Circuits and Systems–II: Analog and Digital Signal Processing, vol. 39, No. 1, pp. 35–51, Jan. 1992.
L. Richard Carley, "A Noise–Shaping Coder Topology for 15+ Bit Converters" IEEE Journal of Solid–State Circuits, vol. 24, No. 2, pp. 267–273, Apr. 1989.
Louis A. Williams, III, "An Audio DAC with 90dB Linearity Using MOS to Metal–Metal Charge Transfer" Texas Instruments.

* cited by examiner

*Primary Examiner*—Peguy JeanPierre
*Assistant Examiner*—Joseph J Lauture
(74) *Attorney, Agent, or Firm*—J. Dennis Moore; W. James Brady, III; Frederick J. Telecky, Jr.

(57) ABSTRACT

A method for use in a system including an analog-to-digital converter subsystem (ADC) and a digital-to-analog converter subsystem (DAC), wherein the ADC samples an input signal at each of a sequence of sample times and provides a sequence of digital outputs representing the magnitude of the sampled input signal. The method is applicable to such systems in which the DAC includes a plurality of elements, such as capacitors or current sources, each connectable in a plurality of different ways in accordance with the digital outputs so as to contribute a portion of an analog output signal corresponding to the digital output, the magnitude of the portion being determined by a way the element is connected. The method is one for shuffling the elements, and includes the following steps. A plurality of coded analog signals are generated based on the input voltage, each such coded analog signal being above or below a predetermined threshold so as to correspond to a way one of the elements is connected. A predetermined sequence of control codes is provided. The coded analog signals are shuffled in accordance with the sequence of control codes. The shuffled coded analog signals are latched as digital values, and the plurality of elements are connected in ways determined in accordance with the shuffled codes.

8 Claims, 5 Drawing Sheets

HIGH SPEED ANALOG-DOMAIN SHUFFLER FOR ANALOG TO DIGITAL CONVERTER

This application claims priority under 35 U.S.C. §119(e)(1) of provisional application No. 60/173,043, filed Dec. 23, 1999.

TECHNICAL FIELD OF THE INVENTION

The present invention relates to analog to digital converter (hereinafter "ADC") systems using dynamic element matching (or shuffling), such as capacitor or current source shuffling, and, more particularly, to a method and apparatus for providing such shuffling with improved efficiency.

BACKGROUND OF THE INVENTION

Many types of commercial ADCs exist. Two examples are the Σ-Δ type and the pipelined type. Many architectures exist for both types. In addition, within a number of such architectures for both types of ADCs, capacitor shuffling or current sink/source shuffling is provided in order to reduce capacitor or current sink/source mismatch distortion. A simple, second-order Σ-Δ converter with shuffling is shown in FIG. 1 as an example to illustrate a conventional implementation of shuffling.

The converter includes a first analog summing node 1, a first analog integrator 2, a second analog summing node 3, a second analog integrator 4, a coarse ADC 5, which is typically a flash ADC, a shuffler unit 6 and a digital to analog converter 7. An analog signal $V_{IN}(X)$ is applied on an input node 8 to analog summing node 1. The output of analog summing node 1 is provided as an input to analog integrator 2. The output of analog integrator 2 is provided as an input to analog summing node 3. The output of analog summing node 3 is provided as an input to analog integrator 4. The output of analog integrator 4 is provided as an input to coarse ADC 5. The output of coarse ADC 5 is provided on node 9 as an output of the Σ-Δ converter, and is provided as an input to shuffler unit 6. The output of shuffler unit 6 is provided as an input to DAC 7. The output of DAC 7 is provided to a subtracting input of summing node 1 and of summing node 3.

The feedback loop in the Σ-Δ converter of FIG. 1 keeps the average of the digital output Y equal to the average of the analog input X. This is accomplished by integrating the difference between X and the analog equivalent of Y in integrator 2, and by integrating the difference between the output of integrator 2 and the analog equivalent of Y in integrator 4. As is known in the art, the quantization error of the coarse ADC is pushed out to frequencies out of the signal bandwidth and can be digitally filtered out. This results in a high resolution ADC, even though the coarse ADC embedded in the loop has low resolution.

In conventional digital domain shuffling schemes for the Σ-Δ type of converter the shuffling network takes the digital output of the coarse quantizer (ADC), shuffles it, and then sends the shuffled digital code to the DAC. In a pipelined ADC, the coarse quantizer is also typically a flash ADC. In pipelined ADCs the shuffling network takes the output of the latches in the flash ADC as its inputs. Examples of such digital domain shuffling schemes can be found in L. R. Carley, "Noise Shaping Coder Typology for 15-bit Converters," *IEEE J. Solid-State Circuits*, S.C. 24 No. 2, pp. 267–273, April 1989; B. H. Leung and S. Sutarja, "Multibit Σ-Δ A/D Converter Incorporating a Novel Class of Dynamic Element Matching Techniques," *IEEE Trans. Circuits and Syst. II*, Vol. 39, No. 1, pp. 35–51, January 1992; F. Chen and B. Leung, "A High Resolution Multibit Sigma-Delta Modulator with Individual Level Averaging," *IEEE J. Solid-Stagte Circuits*, vol. 30, pp. 453–460, April 1995; R. T. Baird and T. Fiez, "Improved Σ-Δ DAC Linearity Using Data Weighted Averaging," Proc. 1995 *IEEE Int. Symp. Circuits Sys.*, Vol. 1, pp. 13–16, May 1995; R. Adams and T. Kuan, "Data-Directed Scrambler for Multi-Bit Noise Shaping D/A Converters," U.S. Pat. No. 5,404,142, Assigned to Analog Devices, Inc., Apr. 4, 1995; and "W. Williams III, "An Audio DAC with 90 dB Linearity using MOS to Metal-Metal is Charge Transfer," *ISSCC Dig. Tech. Papers*, pp. 58–59, San Francisco, 1998.

In both types of ADC, the shuffling schemes are implemented in the digital domain, after the latch in the flash ADC, limiting the overall speed of the ADC. It is, therefore, desired to have an ADC having shuffling, but with less speed degradation from such shuffling than is the case in the prior art.

SUMMARY OF THE INVENTION

The present invention provides a method for use in a system including an analog-to-digital converter subsystem (ADC) and a digital-to-analog converter subsystem (DAC), wherein the ADC samples an input signal at each of a sequence of sample times and provides a sequence of digital outputs representing the magnitude of the sampled input signal. The method is applicable to such systems in which the DAC includes a plurality of elements, such as capacitors or current sources, each connectable in a plurality of different ways in accordance with the digital outputs so as to contribute a portion of an analog output signal corresponding to the digital output, the magnitude of the portion being determined by a way the element is connected. The method is one for shuffling the elements, and includes the following steps. A plurality of coded analog signals are generated based on the input voltage, each such coded analog signal being above or below a predetermined threshold so as to correspond to a way one of the elements is connected. A predetermined sequence of control codes is provided. The coded analog signals are shuffled in accordance with the sequence of control codes. The shuffled coded analog signals are latched as digital values, and the plurality of elements are connected in ways determined in accordance with the shuffled codes.

These and other features of the invention will be apparent to those skilled in the art from the following detailed description of the invention, taken together with the accompanying drawings.

DESCRIPTION OF THE PREFERRED EMBODIMENTS OF THE PRESENT INVENTION

The preferred embodiment of the present invention is described herein with application to pipelined ADCs. However, it will be clear to those of ordinary skill in the art that the principles are equally applicable to $\Sigma$-$\Delta$ ADC, and implementations in $\Sigma$-$\Delta$ ADCs will be readily accomplished by such designers, once the principles as set forth herein are understood.

Figure 2:
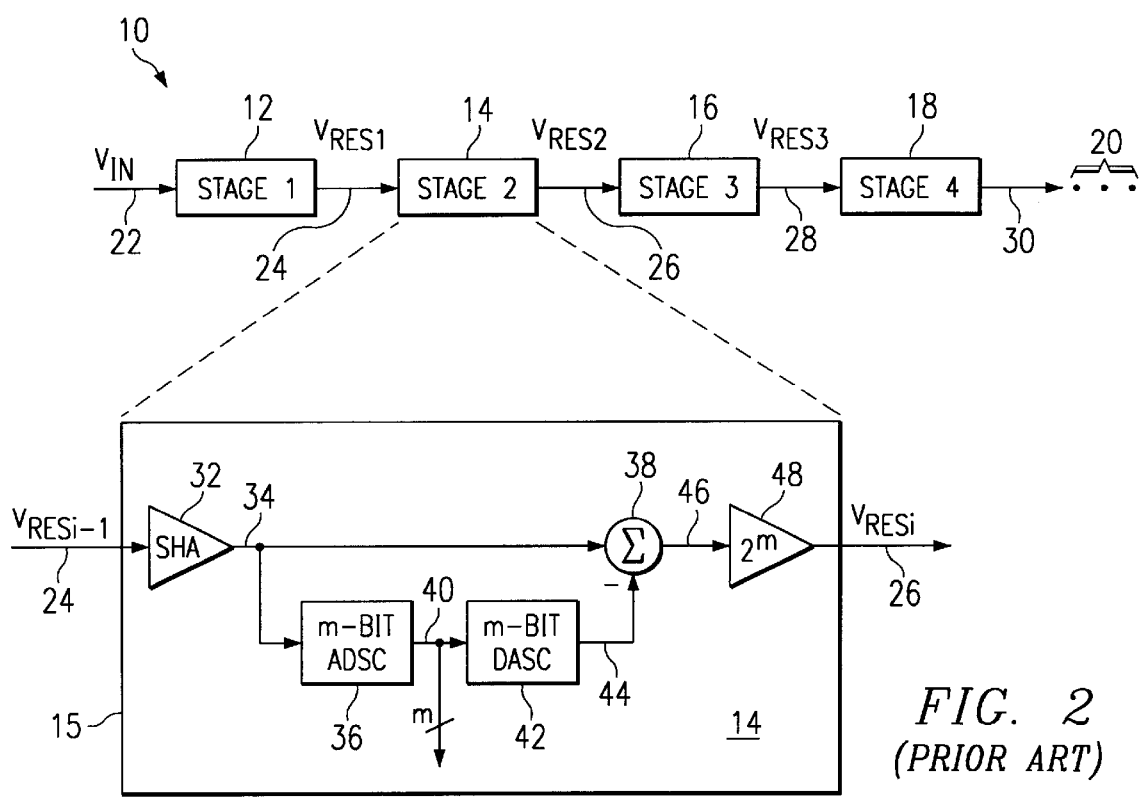
FIG. 2 is a block diagram of a prior art pipelined analog to digital converter.

A conventional multi-bit per stage, pipelined ADC 10 is shown in FIG. 2. Four stages 12, 14, 16, 18 are shown; however, as shown by ellipsis 20, further stages may be included. An analog input signal $V_{IN}$ is provided on line 22 to stage one 12. A first residual signal $V_{RES1}$ is provided on line 24 from stage one 12 to stage two 14. A second residual signal $V_{RES2}$ is provided on line 26 from stage two 14 to stage three 16. A third residual signal $V_{RES3}$ is provided on line 28 from stage three 16 to stage four 18. A further residual signal is provided from stage four 18 on line 30, and so forth.

Typically, all of the stages of a pipelined ADC such as ADC 10 are the same. In FIG. 2, the functional components of stage two 14 are shown by way of example. Thus, referring to the blowup 15 of stage two 14, input line 24 can be seen, which is an input to sample and hold amplifier ("SHA") 32. The output of SHA 32 is provided on line 34 to an m-bit analog-to-digital 20 subconverter (ADSC) 36, which is typically a flash ADC, and to a first input of a summing unit 38. The output of m-bit ADSC 36 is an m-bit sub-word, which is provided on line 40 both as an output to stage two 14 and is provided as an input to m-bit digital-to-analog subconverter (DASC) 42. The output of m-bit DASC 42 is provided on line 44 to a subtracting input to summing unit 38. The output of summing unit 38 is provided on line 46 to a $2^m$ amplifier 48, which has a theoretical gain of $2^m$. The output of $2^m$ amplifier 48 is provided on line 26.

In operation, stage two 14 operates as follows. An analog signal is provided on line 24 to SHA 32. SHA 32 samples the analog signal on line 24 at a succession of times and holds each such sample as a signal level on line 34 for a time sufficient to permit m-bit ADSC 36 to sense the level of the signal on line 34 and provided a digital representation thereof, as a sub-word of m-bits, on line 40. Those m-bits are converted to an analog voltage signal by m-bit DASC 42, and provided on line 44. The analog signal on line 44 is subtracted from the input signal on line 34 by summing unit 38, and the difference signal is provided on line 46 to amplifier 48, where it is amplified by a factor of $2^m$. The difference signal on line 46 represents the negative of the error made by the m-bit ADSC 36. Theoretically, that error signal represents the inaccuracy of the m-bit representation of the analog signal on line 24 due to the limited number of bits. That error signal, amplified by $2^m$, is input to the following stage of the pipeline via line 26, where a similar set of operations is performed.

After the signal propagates through n stages, a digital sample of the input signal $V_{IN}$ is obtained. Each of the sub-word bit lines provided at the output of the respective stage's ADSC, e.g., bit lines 40 from ADSC 36, contributes to the overall digital word which is the digital representation provided by ADC 10 of the sampled signal $V_{IN}$. The sub-word bit lines are concatenated to form this word. A new word is generated for each time period for which a sample is taken in the sample and hold amplifiers, e.g., SHA 32.

Figure 3:
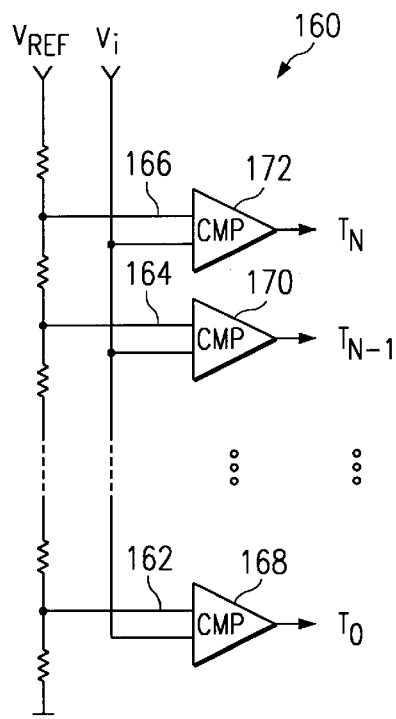
FIG. 3 is a circuit diagram of a typical prior art flash A/D.

FIG. 3 is a circuit diagram of a typical prior art flash ADC, such as used as an m-bit ADSC 36 (FIG. 2), for example. A series string of resistors 160, all having substantially the same resistance value, is connected between a positive reference voltage $V_{REF}$ and a negative reference voltage $-V_{REF}$. The common connection nodes of adjacent resistors form a number of tap points 162, . . . 164, 166, that are provided to the same number of comparators 168, . . . , 170, 172. An analog input voltage $V_i$ is provided to the other input of each of the comparators 168, . . . , 170, 172. Designating the scaled reference voltage at the tap points as $V_{REFn}$, a given comparator outputs a 1 if $V_i > V_{REFn}$, and outputs a 0 if $V_i < V_{REFn}$. These outputs of the comparators 168, . . . , 170, 172, are designated $T_0$, . . . $T_{N-1}$, $T_N$, respectively, and together form a code commonly referred to as a thermometer code (TC). The TC is a digital representation of the analog input voltage $V_i$. The TC is converted to a binary code, which is the m-bit sub-word discussed above in connection with in FIG. 2.

Figure 4:
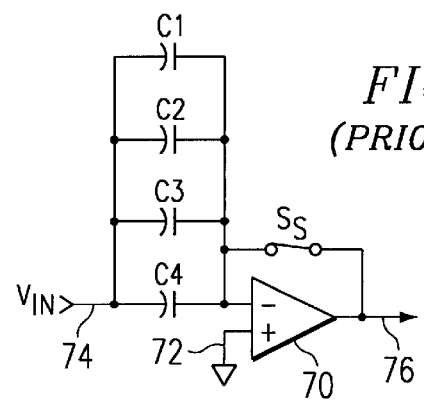
FIG. 4 is a circuit diagram of a pertinent portion of a sample and hold amplifier in a first phase configuration.

FIG. 4 a circuit diagram of pertinent portions of a pipelined stage, such as stage 15 (FIG. 2), as configured in a first phase, that of sampling. In the circuit of FIG. 4 is a differential amplifier 70, having a non-inverting input connected to ground by way of a line 72. An input line 74 provides an analog input voltage $V_i$ to a set of capacitors C1, C2, C3, C4, all of which capacitors are connected in parallel between the input line 74 and an inverting input of amplifier 70. The use of four capacitors is, exemplary, the actual number employed in a particular design depending upon a number of well known factors, such as the architecture, performance desired versus the chip area to be occupied by the sample and hold amplifier, and the like. The inverting input of amplifier 70 is also connected by way of a switch $S_S$ to the output of amplifier 70, line 76. Thus, switch $S_S$ provides a virtual ground connection for capacitors C1, C2, C3, C4, so that they can charge up during the sample phase, and capture the sampled voltage $V_i$ at the sample time. It is necessary that the capacitors be connected to a virtual ground or AC ground, collectively referred to herein simply as AC ground, for this purpose. Switch $S_S$ is opened at the end of the sample phase to capture that charge for use in the next, amplifying phase.

Figure 5:
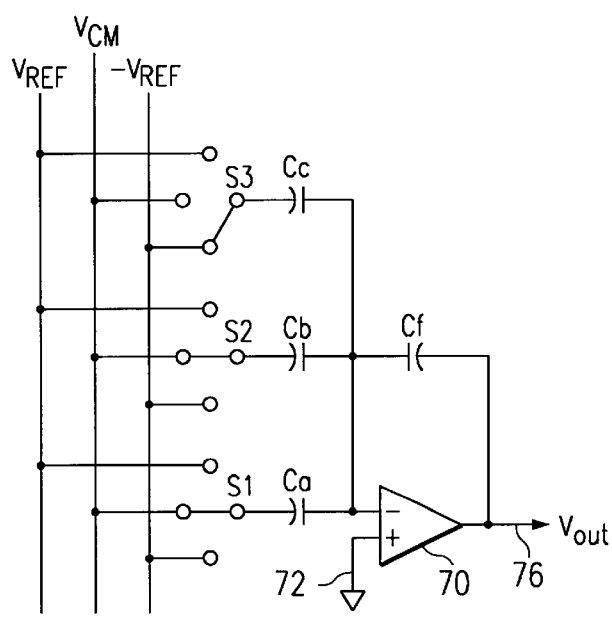
FIG. 5 is a circuit diagram of a pertinent portion of a sample and hold amplifier in a second phase configuration.

FIG. 5 is a circuit diagram of the circuit of FIG. 4, as configured in a second phase, that of amplification. As can be seen, in FIG. 5 one of the capacitors C1, C2, C3, C4, designated Cf in FIG. 5, is now connected as a feedback capacitor between the output line 76 and the inverting input of amplifier 70. The other three capacitors are now all connected in parallel together as DAC capacitors, designated Ca, Cb, and Cc in FIG. 5, between the negative input of amplifier 70 and to a respective one of a corresponding number of switches S1, S2, S3. Each of these switches, S1, S2, S3, allows the port of its respective DAC capacitor to be connected to $V_{REF}$, $V_{CM}$, or $-V_{REF}$, depending upon the position of the switch. Note that $V_{CM}$ may not be used and, in addition, more than three reference voltages may be used, depending on the design considerations. The positions of the switches are determined by the value of the thermometer code TC, discussed above, and function to reduce the resulting amplified voltage output, $V_{out}$, of amplifier 70 by an amount corresponding to the value of the m-bit sub-word discussed above in connection with in FIG. 2. This ensures that the output of amplifier 70 is the residue of the stage, for provision to the next stage in the pipeline.

To reduce capacitor mismatch errors, shuffling is employed in such systems. One shuffling technique is to switch the feedback capacitors and DAC capacitors among one another. This may be done randomly, which converts the element mismatch error into white noise. Or, the switching may be done in accordance with some kind of predetermined sequence or pattern, in order to shape the resultant noise into which the mismatch error is converted. The shuffling may be done using a shuffling network, such as a parallel shuffling network.

Figure 6:
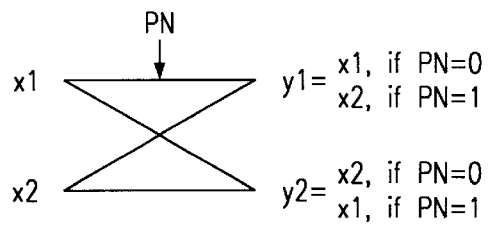
FIG. 6 is a diagram of a swapping cell used in preferred embodiments of the present invention.

A parallel shuffling network (PSN) is made of an arrangement of swapper or swapping cells. An example of a swapper cell is shown in FIG. 6. Based on the control of a one-bit pseudo-random code, PN, the 2 bits output by the swapper cell are either a swapped or non-swapped version of the 2 bits input to the cell. In this case, if PN=0 the output is non-swapped, while if PN=1 the output is swapped. Designating the two bits input to the cell as x1 and x2, then the non-swapped outputs y1 and y2 are equal to x1 and x2, while the swapped output is equal to x2 and x1, as shown in the figure. Swapper cells are well known.

Figure 7:
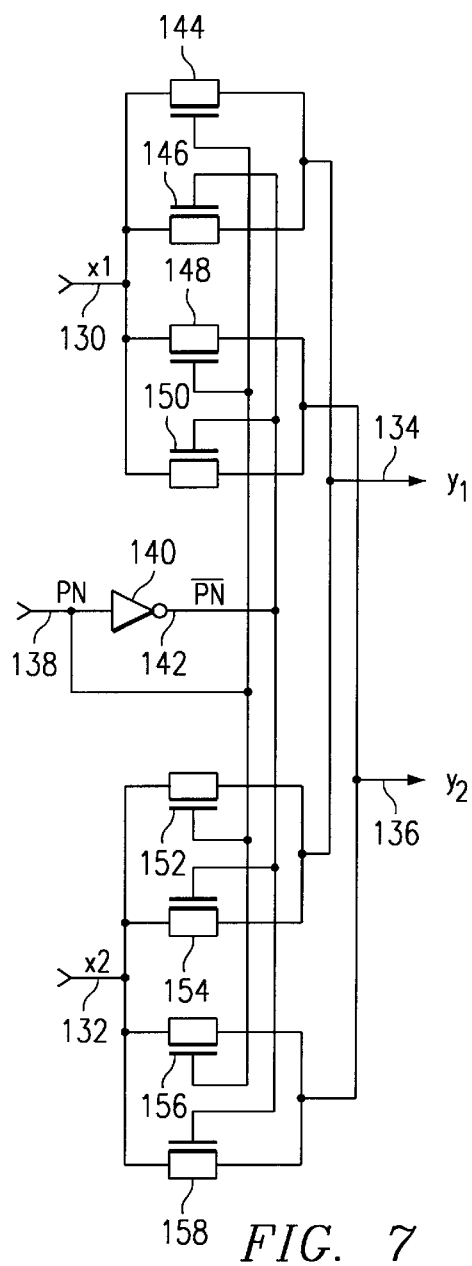
FIG. 7 is a circuit diagram for an implementation of the swapper cell of FIG. 6.

FIG. 7 is a circuit diagram for an implementation of the swapper cell of FIG. 6. The x1 input is provided to input node 130, while the x2 input is provided to input node 132. The y1 output is provided on output node 134, while the y2 output is provided on output node 136. The PN input is provided on input node 138, which is connected to the input of an inverter 140. The output of the converter is connected to node 142 and carries the inverted PN signal, $\overline{PN}$.

Figure 8:
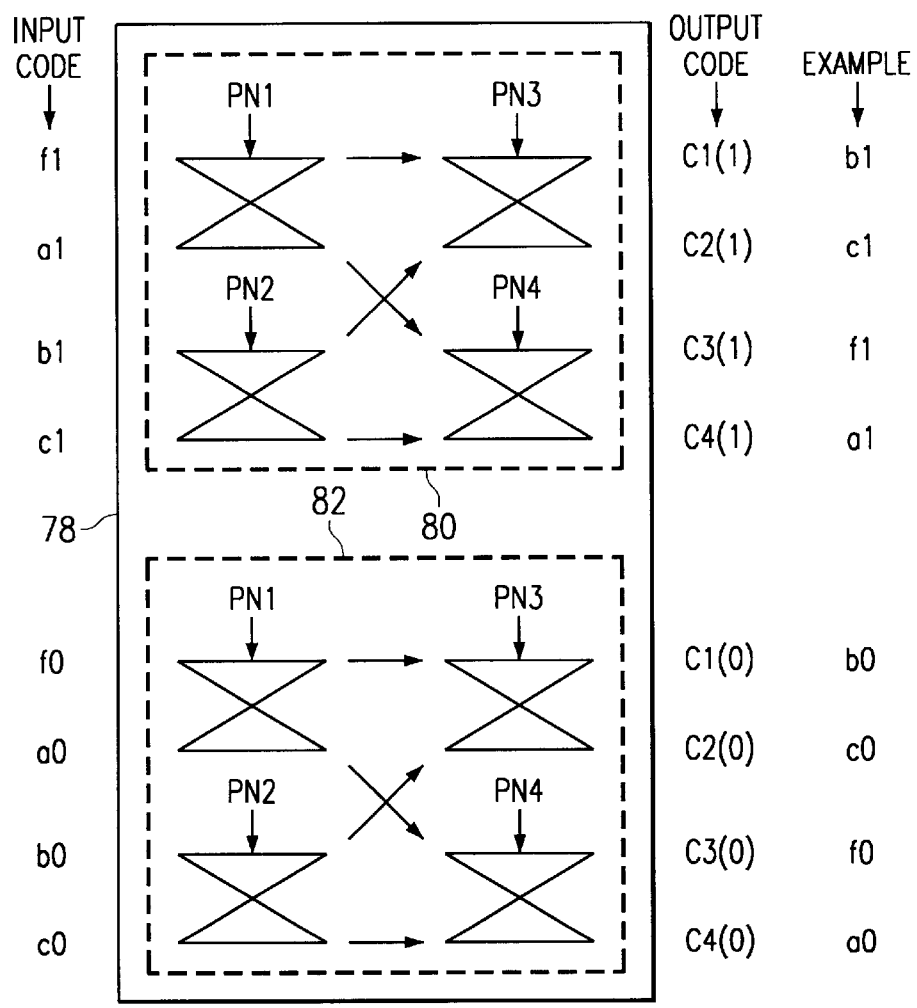
FIG. 8 is a diagram of a parallel shuffling network (PSN).

FIG. 8 shows a PSN 78 of a first preferred embodiment of the present invention. The PSN 78 consists of two identical networks 80, 82, shown in parallel in the figure. Each of the two networks 80, 82, is a 2×2 swapper unit that includes four of the swapper cells described above in connection with FIG. 6. Control signals PN1–4 are applied to the four swapper cells in each of the parallel networks 80, 82, as shown. It will be understood that the PSN 78 includes the circuitry discussed above in connection with FIGS. 4 and 5, with the switching of the capacitors thereof being controlled in accordance with the principles that will now be discussed.

The inputs to the shuffling network are two-bit codes a1a0, b1b0, c1c0, and f1f0. A code of 10 represents the value −1, a code of 00 represents the value 0, and a code of 01 represents the value 1, all used in connection with the designation of a capacitor to be a DAC capacitor. A code of 11 indicates use as a feedback capacitor. Now, it will be recalled that the feedback capacitors are shuffled along with the DAC capacitors, such that the bottom plate of each capacitor can have one of four connections: $V_{REF}$, $V_{CM}$, −$V_{REF}$, and $V_{out}$ of the amplifier 70 (FIG. 5). The three codes a1a0, b1b0, and c1c0, which are derived from the thermometer output TC of the flash ADC used as the ADSC, determine the three possible reference levels $V_{REF}$, $V_{CM}$, and −$V_{REF}$, to which each of the three DAC capacitors are to be connected. A code value of 1 indicates connection to $V_{REF}$, a code value of 0 indicates connection to $V_{CM}$, and a code value of −1 indicates connection to −$V_{REF}$. As mentioned above, a code of 11 indicates use as a feedback capacitor, i.e., connection to $V_{out}$. The feedback capacitor Cf (FIG. 5) is associated with the two-bit code f1f0. The remaining capacitors Ca, Cb and Cc, are associated with codes a1a0, b1b0 and c1c0, respectively.

The two bit input codes are split into MSB and LSB and are input to the top network 80 and the bottom network 82, as shown in FIG. 8. The MSB and LSB are shuffled in parallel based on the control signals PN1–4 which are generated from a pseudo-random number generator (not shown), which may be of any conventional type. Performing the shuffling in parallel ensures the high-speed required by the performance demands found today in many ADC applications, for example 70 MS/s. At the output of the PSN 78, the position where the input code appears indicates whether the capacitor associated with the code is to be connected to $V_{REF}$, $V_{CM}$, −$V_{REF}$, or $V_{out}$ of the op-amp, in accordance with the code scheme described hereinabove. Thus, the top position is associated with C1, the next position down with C2, then C3, with the bottom position being associated with C4.

An example is shown in FIG. 8. As a result of particular control signals PN1–4 which are applied in FIG. 7, f1f0 appears at the third position from the top. Accordingly, C3 is selected as the feedback capacitor Cf (FIG. 5). At the same time, C1, C2, and C4 are selected as the DAC capacitors Cb, Cc and Ca, since the codes b1b0, c1,c0 and a1a0 appear at the first, second and fourth positions from the top at the output of PSN 78.

Applying the code scheme described above, assume that the input codes a1a0, b1b0, and c1c0 are assigned the values −1, −1, and 0, respectively. Based on the example shown in FIG. 8, this means that capacitor C1 which is assigned code b1b0 will be connected to −VREF, capacitor C2 which is assigned c1c0 will be connected to VCM and capacitor C4 which is assigned a1a0 will be connected to −VREF.

Thus, three of the four possible states represented by the two-bit code is used to determine the three possible reference levels VREF, VCM, and −VREF, to which the three DAC capacitors are to be connected. The fourth state of the two-bit code, f1f0, is used to determine if the capacitor is to be a feedback capacitor. In this manner, the feedback capacitor and the DAC capacitors are shuffled simultaneously in high speed.

Figure 9:
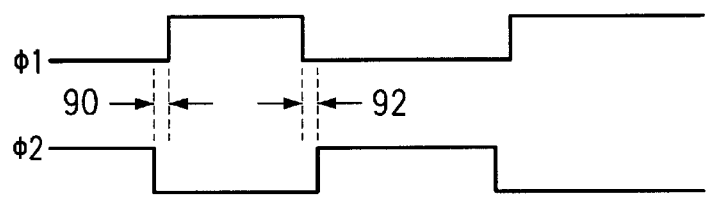
FIG. 9 is a signal timing diagram showing two clocks, a φ1 clock and a φ2 clock.

The usual timing of the pipelined ADC uses the non-overlapping clock scheme shown in FIG. 9, which is a signal timing diagram in which the horizontal axis represents time and the vertical axis represents signal level, showing two clocks, a $\phi 1$ clock and a $\phi 2$ clock. As can be seen, the falling edge of the $\phi 2$ clock precedes the rising edge of the $\phi 1$ clock by interval 90. Likewise, the falling edge of the $\phi 1$ clock precedes the rising edge of the $\phi 2$ clock by interval 92.

On the falling edge of $\phi 1$, the analog input to the first stage op-amp is sampled. At the same time, the comparator outputs T5–T0 are latched and becoming valid. This means that shuffling and capacitor switch decoding has to be ready before the rising edge of $\phi 2$. For high operation, such as that of the THS1470, this is only about 1 ns. Despite the parallel operation of the network shown in FIG. 8, 1 ns is too short for all the required operations to occur. One implementation uses strobing of the comparator about halfway through $\phi 1$. This allows the necessary shuffling operation to complete during the remaining part of $\phi 1$. However, this implementation requires additional clock phases whose falling and rising edges during $\phi 1$ can be undesirably coupled into the sensitive analog circuits and degrade the overall ADC accuracy.

Figure 10:
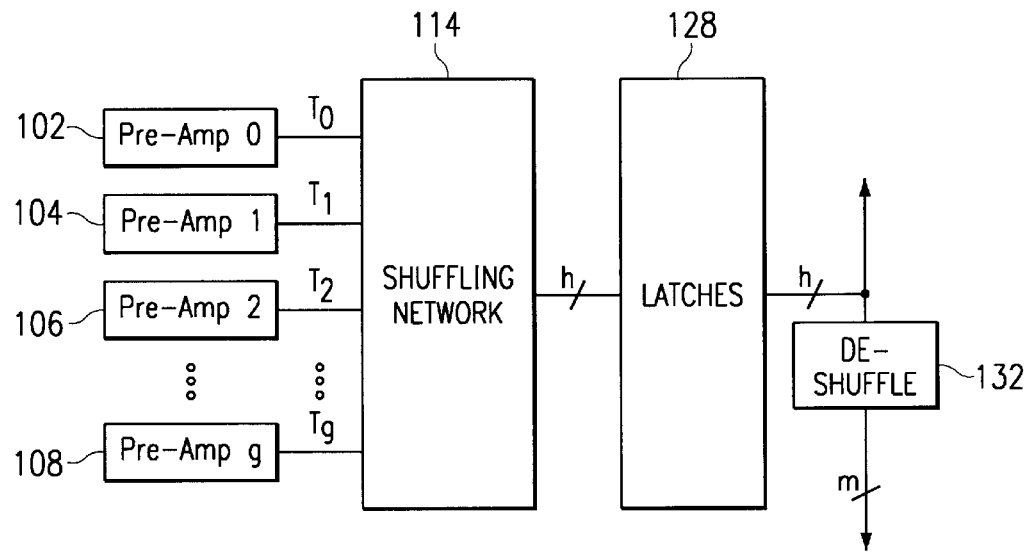
FIG. 10 is an analog circuit implementation of a preferred embodiment of the present invention.

To avoid this speed bottleneck, the shuffling can be implemented as an analog circuit 100, as shown in FIG. 10.

N=g+1 pre-amplifiers (pre-amps) 102, 104, 106, . . . 108, form an ADC, for example a 2.8b flash ADC, which is used as a coarse ADC. A shuffling network 114, such as a parallel shuffling network functioning the same as the PSN 78 of FIG. 8, is inserted between the pre-amps 102, 104, 106, . . . 108, and a set of latches 128. The output of latches 128 is provided on line 130 to the switches controlling the connection of the capacitors (not shown) and to a de-shuffler 132, described in detail below. The output of the de-shuffler 132 is provided to the input of a thermometer code to binary code converter 133, the output of which corresponds, e.g., to the m-bit sub-word provided on line 40 in FIG. 2.

The differential shuffled output is latched on the falling edge of $\phi 1$. This allows the entire non-overlapping time between $\phi 1$ and $\phi 2$ to complete the DAC and feedback capacitor switch decoding. SPICE simulation using the 0.6 um CMOS shows that this decoding can be easily completed in less than 1 ns, validating the analog high speed shuffling operation.

Figure 11:
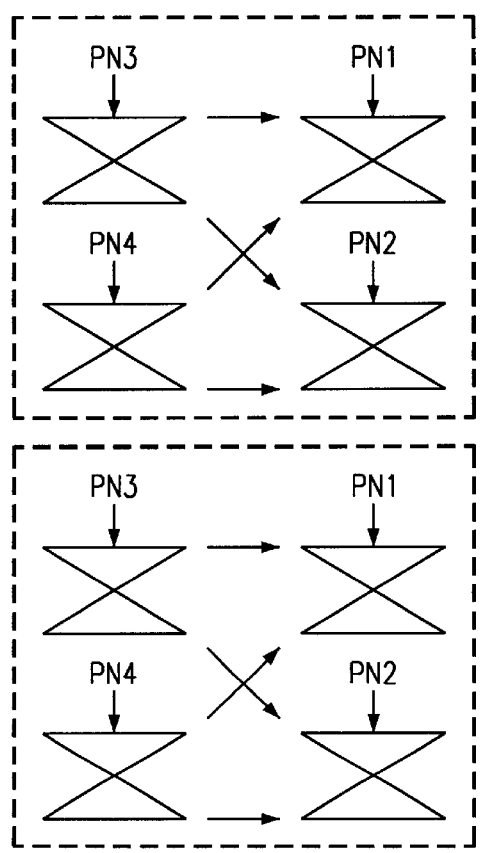
FIG. 11 is a diagram of a parallel de-shuffling network.

An aspect of consideration in the preferred embodiment is in the area of thermometer to binary encoding. Without shuffling, the thermometer codes are latched as digital values and can be directly encoded to binary to form the m-bit sub-word which is the digital output of the stage. However, since in the preferred embodiment it is the output of the analog shuffling network, e.g., PSN 114 of FIG. 10 that is latched, the latch outputs are a digital representation of the shuffled thermometer codes. This shuffled digital representation is difficult to encode to binary. However, since the encoding is in the non-critical path due to the overall pipelined ADC latency, there is sufficient time for encoding. In accordance with the preferred embodiment of the present invention, the de-shuffler 132 (FIG. 10) "de-shuffles" the digital output of the latch by using the same set of PN1–4, but in reverse order. This is shown in the PSN 132 in FIG. 11.

Figure 1:
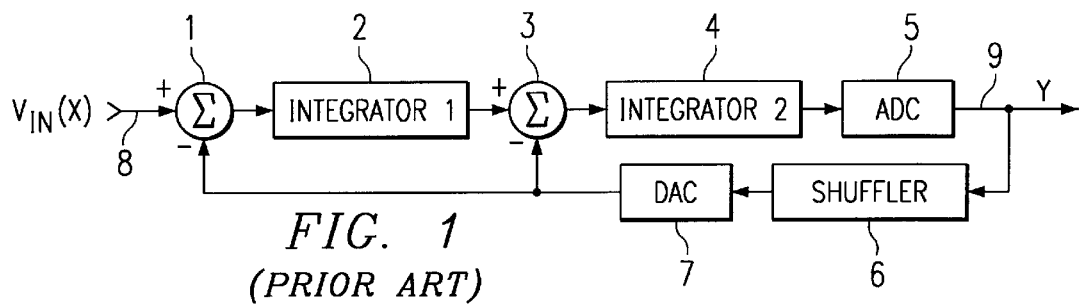
FIG. 1 is a block diagram of a prior art Σ-Δ analog to digital converter

It will be appreciated that the techniques employed in providing shuffling before the latch stage in a pipelined ADC, as discussed above, are equally applicable to $\Sigma$-$\Delta$ converters, as well, such as the $\Sigma$-$\Delta$ converter discussed above in connection with FIG. 1. The coarse ADC in the $\Sigma$-$\Delta$ converter is similar in essentials to the ADC shown in FIG. 10. Consequently, the shuffler can be placed before the latches in such converters, i.e., in the analog domain, as well. As in the case of the pipelined ADC, the shuffler takes as its inputs the analog output of the pre-amps, shuffles them and passes them to the latches. The shuffled output of the latches in the coarse ADC are provided as inputs to the DAC which follows in the converter. As in the case of the pipelined ADC, the output of the coarse ADC must be de-shuffled before being passed to another functional unit, such as a thermometer code to binary converter.

Note that the circuits discussed above are single ended, for ease of explanation. The principles implemented in such circuits are essentially the same for circuits that are fully differential, and the considerations involved in implementing the present invention are essentially the same as those discussed herein, with the considerations applying to both differential paths, rather than to only the one path in a single-ended circuit.

Figure 12:
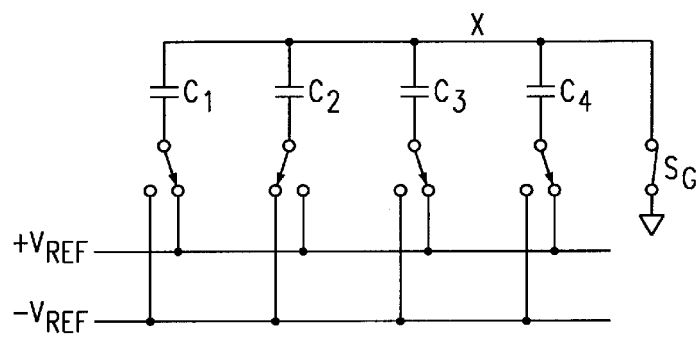
FIG. 12 is a diagram an arrangement of four capacitors as might be used in a generic DAC of a pipelined stage, and as may be controlled according to the present invention.

In addition, while the circuits described above employ capacitor shuffling, the techniques of the present invention are equally applicable to converters employing the shuffling of other elements, such as current sources or sinks. This will now be explained. FIG. 12 is a diagram showing four capacitors C1, C2, C3, C4, as might be used in, say, a generic DAC of a pipelined stage as discussed above, arranged in a manner to aid in the illustration now being discussed. Node X is connected to a switch $S_G$, which can connect node X to an AC ground, virtual ground or some DC voltage $V_{CM}$. In this way, the reference voltages $+V_{REF}$ and $-V_{REF}$ may be sampled by capacitors C1, C2, C3, C4, by closing this switch during a first phase, while during a second phase the charge on the bottom plate of capacitors C1, C2, C3, C4, may be converted into voltage through the use of an op-amp with a capacitor in its feedback path (not shown, in interest of clarity).

Figure 13:
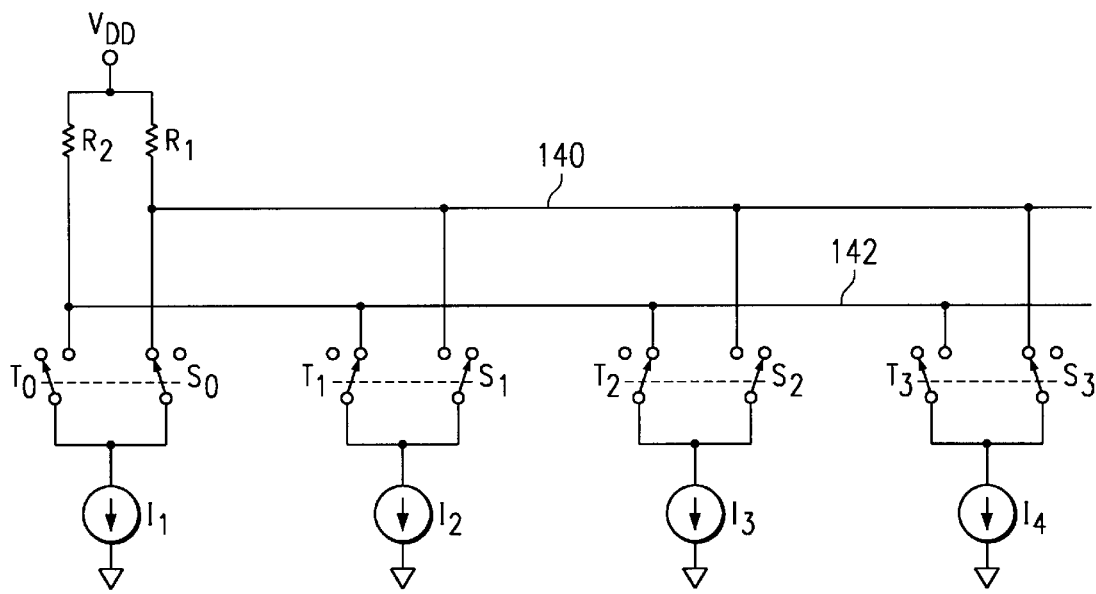
FIG. 13 is a diagram an arrangement of four current sinks as may be controlled according to the present invention.

Now, a generic DAC may also be constructed using current sources or sinks. FIG. 13 is a diagram showing how this is accomplished. Four ideally identical current sinks $I_1$, $I_2$, $I_3$, $I_4$, are connected to either node 140 or to node 142 by switches $S_0$, $S_1$, $S_2$, $S_3$, respectively, under control of digital signals $T_0$, $T_1$, $T_2$, $T_3$, respectively. Node 140 is connected to a supply voltage VDD through a resistor R1, while node 142 is connected to VDD through a resistor R2. The current from each current sink is thus summed at node 140 or 142, depending upon its associated switch connection. These currents are drawn through either R1 or R2, depending upon the node. This, in turn, results in a final voltage difference between node 140 and 142, representing the analog output of the DAC in voltage form. Of course, the number of current sources may vary. In addition, other variations, such as single-ended implementations, implementations using an op-amp with resistive feedback in the place of resistor R1, resistor R2, or both, and the like, exist, and the principles discussed herein are applicable to all such variations, as well.

Figure 14:
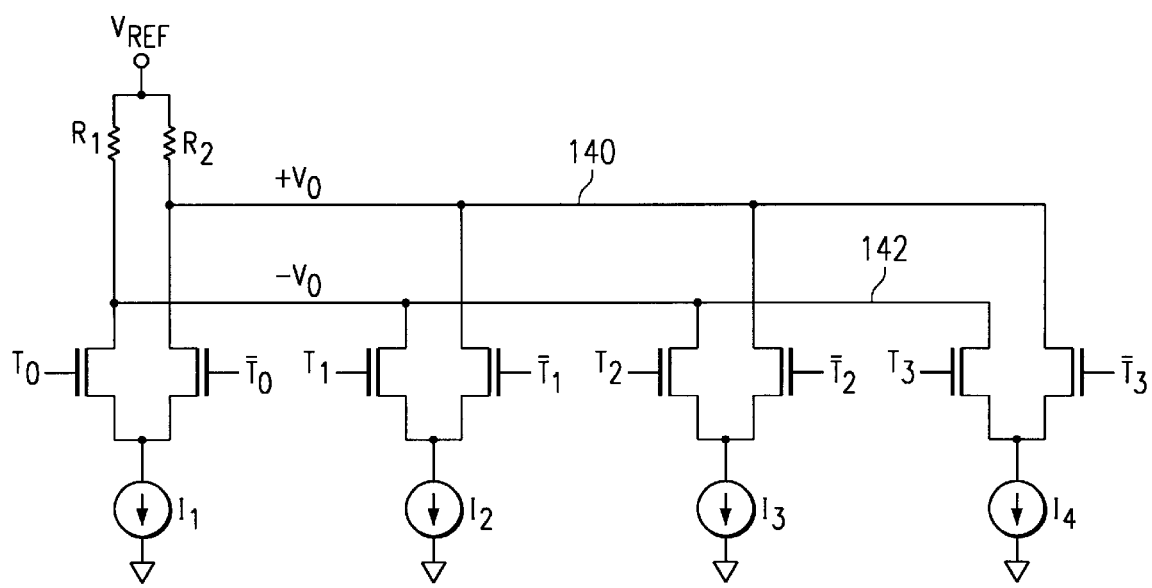
FIG. 14 is a circuit diagram implementing the arrangement shown in FIG. 13.

FIG. 14 is a diagram showing an implementation of the scheme shown in FIG. 13. In FIG. 13 it can be seen that the switches $S_0$, $S_1$, $S_2$, $S_3$, are implemented as MOS transistor control of differential digital signals $T_0$, $\overline{T_0}$, $T_1$, $\overline{T_1}$, $T_2$, $\overline{T_2}$, $T_3$, $\overline{T_3}$, respectively.

Although the present invention and its advantages, as well as several embodiments have been described in detail it should be understood that various other changes, substitutions and alterations, additional to those described herein, can be made without departing from the spirit and scope of the invention as defined by the appended claims. For example, while the input signals operated on by the circuits described above are analog voltages, the principles of the present invention are equally applicable to systems and circuits wherein the input signals are analog currents. Further, the coded signals, such as codes a1a0, b1b0, c1c0, and f1f0, described above, may also be coded analog currents, as well. Further, it is also important to understand that the present invention involves shuffling done in the analog domain at any place preceding the latches, not just immediately preceding the latches. For example, a bank of two-stage pre-amps may be provided, and the shuffling can be done between the pre-amp stages. In addition, while all of the capacitors are described above as being connected to the input voltage during sampling, some capacitors may be connected during sampling to a reference voltage, for example, and still be part of the shuffling. All such variations and embodiments are considered within the scope of the invention as set forth in the appended claims.

What is claimed is:

1. In a system including an analog-to-digital converter subsystem (ADC) and a digital-to-analog converter subsystem (DAC), wherein said ADC samples an input signal at each of a sequence of sample times and provides a sequence of digital outputs representing the magnitude of said sampled input signal, and wherein said DAC includes a plurality of elements each connectable in a plurality of different ways in accordance with said digital outputs so as to contribute a portion of an analog output signal corresponding to said digital output, the magnitude of said portion being determined by a way said element is connected, a method for shuffling said elements comprising the steps of:

generating a plurality of coded analog signals based on said input voltage, each such coded analog signal being above or below a predetermined threshold so as to correspond to a way one of said elements is connected;

providing a predetermined sequence of control codes;

shuffling said coded analog signals in accordance with said sequence of control codes;

latching said shuffled coded analog signals as digital values; and connecting said plurality of elements in ways determined in accordance with said shuffled codes.

2. A method according to claim 1, wherein said plurality of elements comprise a plurality of current sinks or sources.

3. In an analog-to-digital converter that samples an input signal at each of a sequence of sample times and provides a sequence of digital outputs representing the magnitude of said sampled input signal, said converter including an amplifier and said converter including a plurality of capacitors which, for each of said digital outputs, may be connected at said sample time between said input signal and AC ground, and which may be connected at a second time between an input of said amplifier and one of a plurality of reference voltage sources, a method for shuffling said capacitors comprising the steps of:

generating a plurality of coded analog signals based on said input voltage, each such coded analog signal being above or below a predetermined threshold so as to correspond to the connection of one of said capacitors between said input of said amplifier and said at least one reference voltage source;

providing a predetermined sequence of control codes;

shuffling said coded analog signals in accordance with said sequence of control codes;

latching said shuffled coded analog signals as digital values; and at said second time, connecting said plurality of capacitors between said input of said amplifier and one of said plurality of reference voltage sources, in accordance with said shuffled codes.

4. A method according to claim 3, wherein said input signal comprises an input analog voltage, and wherein said coded analog signals comprise coded analog voltages.

5. A method according to claim 3, wherein said step of providing a predetermined sequence of control codes is performed by providing a sequence of pseudo-random codes.

6. A method according to claim 3, wherein said step of providing a plurality of coded analog signals is performed by providing a set of thermometer codes from a set of pre-amplifiers.

7. A method according to claim 3, further comprising the steps of:

de-shuffling the codes stored in said plurality of storage locations; and encoding said de-shuffled codes into binary codes.

8. A method according to claim 3, wherein said capacitors may be connected at said second time between said input of said amplifier and an output of said amplifier, wherein said step of generating a plurality of coded analog signals is performed such that said coded analog signals may correspond to the connection of one of said capacitors between said input of said amplifier and said output of said amplifier; and said step of connecting said plurality of capacitors is performed such that said plurality of capacitors may be connected between said input of said amplifier and said output of said amplifier, in accordance with said shuffled codes.

* * * * *